United States Patent
Patel et al.

(10) Patent No.: US 9,645,194 B2
(45) Date of Patent: May 9, 2017

(54) SYSTEMS AND METHODS FOR TESTING MOTOR DRIVES

(71) Applicant: ROCKWELL AUTOMATION TECHNOLOGIES, INC., Milwaukee, WI (US)

(72) Inventors: Yogesh Patel, Grafton, WI (US); Lixiang Wei, Whitefish Bay, WI (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 298 days.

(21) Appl. No.: 14/198,157

(22) Filed: Mar. 5, 2014

(65) Prior Publication Data

US 2015/0253381 A1 Sep. 10, 2015

(51) Int. Cl.
*G01R 31/28* (2006.01)
*G01R 31/42* (2006.01)
*G01R 31/02* (2006.01)

(52) U.S. Cl.
CPC ......... *G01R 31/2848* (2013.01); *G01R 31/02* (2013.01); *G01R 31/025* (2013.01); *G01R 31/42* (2013.01)

(58) Field of Classification Search
None
See application file for complete search history.

(56) References Cited

U.S. PATENT DOCUMENTS

| 5,814,967 | A | 9/1998 | Garces et al. | |
| 6,072,302 | A * | 6/2000 | Underwood | H02J 3/38 322/17 |
| 6,160,414 | A | 12/2000 | Matsubara et al. | |
| 7,495,410 | B2 * | 2/2009 | Zargari | H02M 1/4216 318/438 |

(Continued)

FOREIGN PATENT DOCUMENTS

| CN | 203551697 U | 4/2014 | |
| EP | 1953907 A1 * | 8/2008 | ......... H02M 1/4216 |

(Continued)

OTHER PUBLICATIONS

Extended European Search Report mailed Jul. 9, 2015.

(Continued)

*Primary Examiner* — Jermele M Hollington
(74) *Attorney, Agent, or Firm* — Fletcher Yoder P.C.

(57) ABSTRACT

Systems and methods for testing a motor drive are disclosed. The techniques enhance motor drive testing by not using a dyne-unit, thereby reducing the initial installation costs, maintenance costs, and size of the setup. The setup may include a rectifier and an inverter configured to operate in an active-reactive power control mode during testing under a simulated load by generating the corresponding active (P) and reactive (Q) power (e.g., torque and flux, respectively). The active-reactive power control mode may receive a desired P and Q and determine one or more gate drive signals to provide to switches in the rectifier and/or the inverter based on the desired P and Q, where the gate drive (Continued)

signals are configured to operate the rectifier and/or the inverter under a simulated load. The gate drive signals may be transmitted to the rectifier and/or the inverter accordingly.

17 Claims, 3 Drawing Sheets

(56) References Cited

U.S. PATENT DOCUMENTS

| | | | |
|---|---|---|---|
| 7,683,568 B2* | 3/2010 | Pande | H02M 1/4216 318/438 |
| 2006/0232250 A1* | 10/2006 | Sihler | B60L 11/123 322/58 |
| 2007/0007929 A1 | 1/2007 | Lee et al. | |
| 2008/0180055 A1* | 7/2008 | Zargari | H02M 1/4216 318/729 |
| 2008/0265819 A1 | 10/2008 | Chen et al. | |
| 2010/0088047 A1* | 4/2010 | Campbell | H02P 29/02 702/58 |
| 2011/0025369 A1 | 2/2011 | Quarto | |
| 2011/0133763 A1 | 6/2011 | Schulte et al. | |
| 2012/0013284 A1* | 1/2012 | Campbell | H02H 7/08 318/490 |
| 2012/0081058 A1* | 4/2012 | Bortolus | H02K 11/001 318/490 |
| 2012/0187883 A1* | 7/2012 | Valdez | H02M 1/126 318/490 |
| 2012/0217920 A1 | 8/2012 | Singh et al. | |

FOREIGN PATENT DOCUMENTS

| | | |
|---|---|---|
| EP | 2164169 A1 | 3/2010 |
| JP | 2008295229 A | 12/2008 |

OTHER PUBLICATIONS

Freidrich W Fuchs: "Some diagnosis methods for voltage source inverters in variable speed drives with induction machines a survey", The 29th Annual Conference of the IEEE Industrial Electronics Society, 2003. IECON '03, IEEE Service Center, Piscataway, NJ, vol. 2, Nov. 2, 2003 (Nov. 2, 2003), pp. 1378-1385.

Marian P. Kazmierkowski et al: "High-Performance Motor Drives", IEEE, US, vol. 5, No. 3, Sep. 1, 2011 (Sep. 1, 2011, pp. 6-26, XP011362521, OSSM: 1932-4529, DOI: 10.1109/MIE.2011.942173.

Sangshin Kwak et al: "A hybrid converter system for high performance large induction motor drives", 2004 IEEE Applied Power Electronics Conference and Exposition, APEC 04, IEEE, Anaheim, CA, USA, vol. 1, Feb. 22, 2004 (Feb. 22, 2004), pp. 529-536.

Lipo T A: "Recent Progress in the Development of Solid-State AC Motor Drives", IEEE Transactions on Power Electronics. Institute of Electrical and Electronics Engineers, USA, vol. 3, No. 2, Apr. 1, 1988 (Mar. 1, 1988), pp. 105-117.

Pan Di et al: "Extension of the Operating Region of an IPM Motor Utilizing Series Compensation", IEEE Transactions on Industry Applications, IEEE Service Center, Piscataway, NJ, US, vol. 50, No. 1, Jan. 1, 2014 (Jan. 1, 2014).

Bhuvaneswari G et al: "Three-phase, two-switch PFC rectifier fed three-level VSI based FOC of induction motor drive" Power India Conference. 2012 IEEE Fifth, Dec. 19, 2012 (Dec. 19, 2012).

Chong H NG et al: "Unbalanced-Grid-Fault Ride-Through Control for a Wind Turbine Inverter", IEEE Transactions on Industry Applications, IEEE Service Center, Piscataway NJ, US, vol. 43, No. 3, May 1, 2008 (May 1, 2008).

* cited by examiner

SYSTEMS AND METHODS FOR TESTING MOTOR DRIVES

BACKGROUND

The present disclosure relates generally to motor drives, and more particularly to systems and methods for testing motor drives.

Electric motors and motor drives are generally used throughout industrial, commercial, material handling, process and manufacturing settings, to mention only a few. For example, in a manufacturing setting, a motor drive may provide drive power to an electric motor used to turn a conveyer belt. A typical motor drive employed with a single or three phase induction motor utilizes power from the power grid, and performs power conversion to produce output power with desired current, voltage, or frequency characteristics. After being built, motor drives are usually tested for quality and developmental assurance.

Indeed, there are numerous tests that are run on motor drives. Oftentimes, the motor drives are tested using a dyne-unit. A dyne-unit may generally refer to a load. More specifically, a dyne-unit may include a generator, such as motor(s) and/or transformer(s), electrically coupled to common bus inverter(s), active front end (AFEs), inductor(s), capacitor(s), and/or alternating current (AC) pre-charge circuitry. Drive unit tests may be performed on the motor drive to determine whether the proper power is being generated and output to the connected dyne-unit (e.g., load). However, it is now recognized that dyne-units are expensive to install and take up a great deal of space. Further, it is now recognized that dyne-units require frequent maintenance to repair the motor(s), further adding to the cost of ownership, and they may be inefficient due to numerous electro-mechanical conversions involved. Accordingly, it is now recognized that there is a need to improve motor drive testing.

BRIEF DESCRIPTION

Certain embodiments commensurate in scope with the originally disclosed subject matter are summarized below. These embodiments are not intended to limit the scope of the claimed subject matter, but rather these embodiments are intended only to provide a brief summary of possible forms of the disclosed subject matter. Indeed, the disclosure may encompass a variety of forms that may be similar to or different from the embodiments set forth below.

A first embodiment provides a system including an input transformer configured to electrically couple to a power grid, an input inductor electrically coupled to the input transformer, a rectifier electrically coupled to the input inductor, an inverter electrically coupled to the rectifier, an output inductor electrically coupled to the inverter, an output transformer electrically coupled to the output inductor and configured to electrically couple to the power grid, and control circuitry. The control circuitry is configured to receive a desired active power (P) and a desired reactive power (Q) associated with a test of the system, determine one or more gate drive signals based on the desired P and Q, and begin execution of the test by communicating the one or more gate drive signals to a first set of switches in the rectifier, a second set of switches in the inverter, or a combination thereof, wherein the rectifier, the inverter, or the combination thereof, is configured to operate under a simulated load that corresponds to the desired P and Q based on the gate drive signals.

A second embodiment provides a method including initiating, via a processor, one or more tests on a motor drive comprising a rectifier and an inverter electrically couple to each other, receiving, via the processor, a desired active power (P) and a desired reactive power (Q) associated with the one or more tests on the motor drive, determining, via the processor, one or more gate drive signals to provide to a first set of switches in the rectifier, a second set of switches in the inverter, or a combination thereof, based on the desired P and Q, transmitting the one or more gate drive signals from the processor to the rectifier, the inverter, or the combination thereof, and operating the rectifier, the inverter, or the combination thereof, under a simulated load that corresponds to the desired P and Q based on the gate drive signals.

A third embodiment provides a non-transitory computer-readable medium storing computer instructions, the computer instructions configured to run one or more tests on a motor drive comprising a non-regenerative converter (NRC) and a common bus inverter (CBI) by receiving a desired active power (P) and a desired reactive power (Q) references that represent torque and flux, respectively, corresponding to a simulated load, determine gate drive signals based on the desired P and Q references, wherein the gate drive signals are configured to operate switches of the NRC, CBI, or any combination thereof, under a simulated load that corresponds to the desired P and Q, and transmit the gate drive signals to the NRC, the CBI, or any combination thereof.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
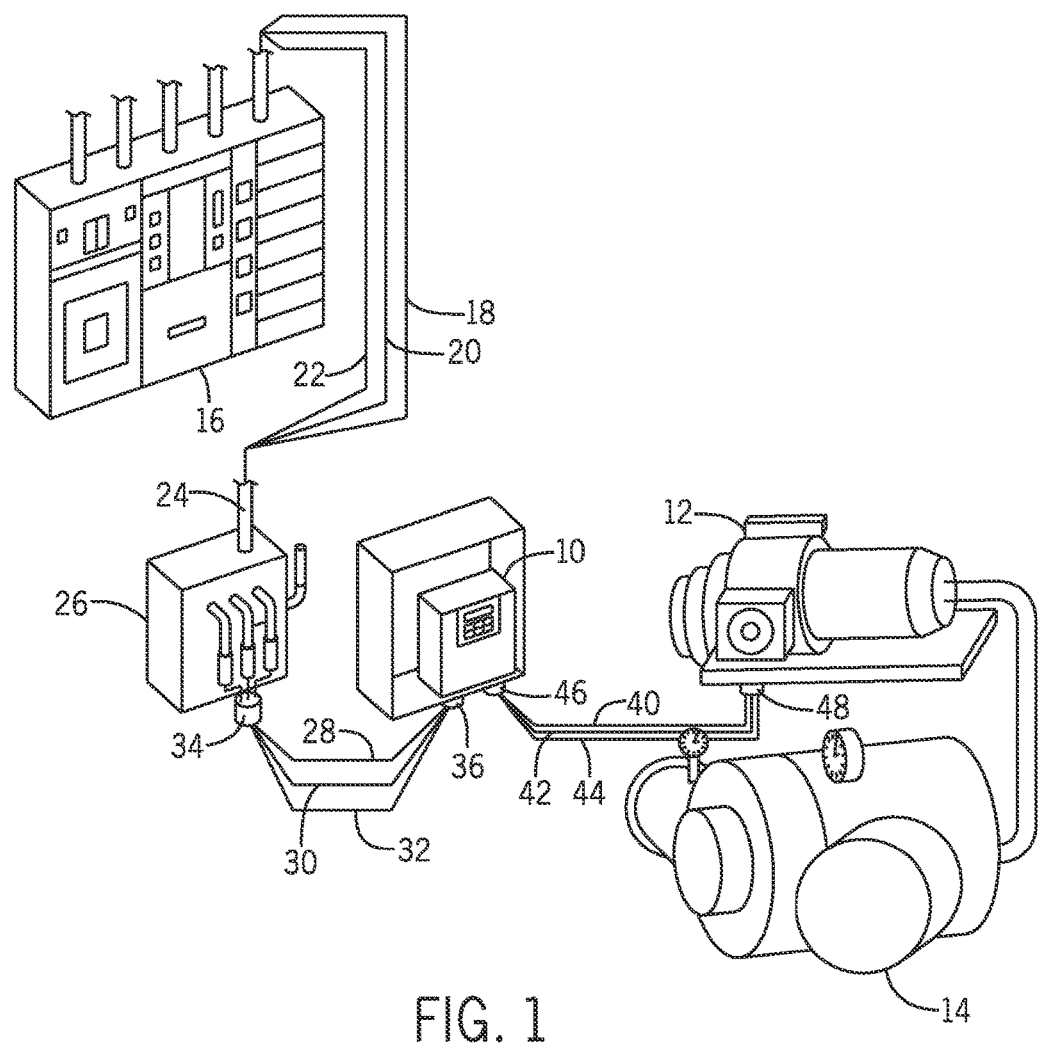
FIG. 1 is a perspective view of an exemplary motor drive electrically connected to an electrical motor driving a load in accordance with embodiments presented herein.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

The present disclosure relates to systems and methods for testing motor drives using a dyne-less setup in order to reduce the initial cost of installation of the setup, the cost of maintaining the setup, and the size of the setup, among other things. As previously discussed, a dyne-unit may refer to a load to which the motor drive is supplying power. The dyne-unit may include a generator, such as motor(s) and/or transformer(s), electrically coupled to common bus inverter(s), active front end (AFEs), inductor(s), capacitor(s), and/or alternating current (AC) pre-charge circuitry. The present techniques enable removing the dyne-unit from the test setup by utilizing a rectifier and inverter, such as a non-regenerative converter (NRC) and common bus inverter (CBI), respectively, that function as a motor drive in conjunction with an active-reactive power control mode ("P-Q control mode") that may simulate a load. In certain embodiments, the P-Q control mode may provide the same functions that the AFE(s) provide in dyne-unit setups. In particular, the P-Q control mode may generate a sinusoidal wave with characteristics that match the measured three phase power supplied by the power grid. Specifically, the P-Q control mode may receive desired active (P) and reactive (Q) power values that may represent a torque and a flux, respectively. Then the P-Q control mode may determine gate drive signals based on the desired P and Q power values and send the gate drive signals to switches in the NRC and/or CBI in order to generate the desired torque and flux to simulate a load.

In order to achieve this, the P-Q control mode may be utilized by the CBI before testing to create a phase-locked loop (PLL) to measure the input power grid side voltage using line voltage sensing in a feedback loop and syncing the motor drive's output power accordingly. In addition, an output inductor may be utilized to filter out harmonics before outputting the power to an output transformer that delivers the power back to the power grid. In this way, the output transformer's temperature may be reduced. Due to the fact that few power conversion units are used in the setup disclosed, the efficiency of the motor drive testing may be improved. Certain motor specific tests may not be run since a motor may not be included in the dyne-less setup. However, the disclosed techniques enable running many development and qualification tests that are typically run for motor drives at rated frequency and voltage. The compact size of the setup, the ease of configuring the setup, the cost effectiveness of the setup, and the increased efficiency gains of the setup, among other things, make the setup an advantageous configuration for testing motor drives.

By way of introduction, a perspective view of an exemplary motor drive 10 electrically connected to an electric motor 12 (e.g., induction motor, synchronous motor, etc.) driving a load 14 in accordance with an embodiment of the present approach is displayed in FIG. 1. In some embodiments, the motor drive 10 may be a POWERFLEX® drive manufactured by Rockwell Automation of Milwaukee, Wis. As depicted, a three phase power source (lines 18, 20, 22) accessed via main switchgear 16 is electrically coupled to an input terminal 24 at a disconnect switch 26. The switchgear 16 may selectively connect and/or disconnect the three-phase electrical power supplied by the power source from the electric motor 12 that drives the load 14, which may be a valve, transformer, fan, pump, or the like. For example, switching devices in the switchgear 16 may close to connect electrical power to the electric motor 12. On the other hand, the switching devices in the switchgear 16 may open to disconnect electrical power from the electric motor 12. In some embodiments, the power source may be an electrical grid. It should be noted that the three-phase implementation described herein is not intended to be limiting, and the disclosed techniques may be employed on single-phase circuitry, as well as on circuitry designed for other applications.

In some embodiments, operation of the switchgear 16 (e.g., opening or closing of switching devices) may be controlled by control and monitoring circuitry. More specifically, the control and monitoring circuitry may instruct the switchgear 16 to connect or disconnect electrical power. Additionally, the control and monitoring circuitry may be remote from the switchgear 16. In other words, the control and monitoring circuitry may be communicatively coupled to the switchgear 16 via a network. In some embodiments, the network may utilize various communication protocols such as DeviceNet, Profibus, or Ethernet. The network may also communicatively couple the control and monitoring circuitry to other parts of the system, such as other control circuitry or a human-machine-interface (not shown). Additionally, or alternatively, the control and monitoring circuitry may be included in the switchgear 16 or directly coupled to the switchgear, for example, via a serial cable. The switching devices included in the switchgear 16 may include relays, contactors, circuit breakers, and the like.

Further, the disconnect switch 26 may be configured to interrupt power to the motor drive 10 or other electrical devices. The disconnect switch 26 may be used in a wide variety of settings, but typically it is utilized as a safety device that de-energizes the motor drive 10, thereby de-energizing the electric motor 12, which will cease driving the load 14, so that people can work on the motor drive 10, the electric motor 12, and/or the load 14 safely. Additionally, lines 28, 30, and 32 may be connected via the output terminal 34 of the disconnect switch 26 to the input terminal 36 of the motor drive 10 in order to provide three phase AC power of constant frequency to the motor drive 10. The motor drive 10 may supply three phase AC power to the electrical motor 12 via lines 40, 42, and 44 electrically connected between the motor drive's 10 output terminal 46 and the electric motor's input terminal 48. The electric motor 12 may convert the electric energy supplied by the motor drive 10 into mechanical energy that drives the load 14.

Typically, motor drives are tested by various development and qualification tests after being built. The presently disclosed setup 60 for improving the testing of motor drives is displayed in FIG. 2. As depicted, the setup 60 includes an input transformer 62 configured to electrically couple to a three phase AC power source, such as the power grid 64, an input inductor 66, a non-regenerative converter (NRC) 68, a common bus inverter (CBI) 70, an output inductor 72, and an output transformer 74. It should be noted that the NRC 68 may be a rectifier and the CBI 70 may be an inverter used for power conversions and any suitable rectifier and inverter may be utilized in the setup 60. Specifically, the input transformer 62 may be configured to electrically couple to the power grid 64 and to the input inductor 66. The input inductor 66 may be configured to electrically couple to the NRC 68, which may also be configured to electrically couple to the CBI 70 via a direct current (DC) bus 71. The CBI 70 may be further configured to electrically couple to the output inductor 72, which may also be configured to electrically couple to the output transformer 74. Finally, the output transformer 74 may be further configured to electrically couple to the power grid 64.

In addition, the setup 60 includes active-reactive power control mode circuitry ("P-Q control mode circuitry") 76. The P-Q control mode circuitry 76 functions to provide an active-reactive power control mode ("P-Q control mode") in which the CBI 70 and/or the NRC 68 may run during testing of a motor drive 78. It should be noted that the motor drive 78 may include the NRC 68 (e.g., rectifier) and the CBI 70 (e.g., inverter). In some embodiments, the P-Q control mode circuitry 76 may include firmware, software, and/or circuitry on a printed control board (PCB) that enable the P-Q control mode. For example, the P-Q control mode circuitry 76 may include computer instructions stored on a non-transitory (not a signal) computer-readable medium. Indeed, the box 76 indicated as the P-Q control mode circuitry 76 may be representative of one or more processors and memories storing the computer-readable instructions for performing P-Q control mode operations, as explained further with reference to FIG. 3. When running in the P-Q control mode, the CBI 70 may control loading on the NRC 68 in order to perform the motor drive 78 tests that require loads. In other words, the P-Q control mode, the NRC 68, and the CBI 70 may simulate a load being connected to the motor drive 78. Thus, the presently disclosed techniques enable performing multiple tests of the motor drive 78 without the use of a dyne-unit because the setup 60 is enabled to simulate a load being connected to the motor drive 78 through the use of the P-Q control mode during testing.

Turning now to the operation of the setup 60, three phase AC power may be supplied to the input transformer 62 via the power grid 64. The frequency of the electrical power supplied via the power grid 64 may be fifty hertz or sixty hertz. In some embodiments, the input transformer 62 may be a variable frequency transformer capable of converting from fifty hertz to sixty hertz and vice versa. Additionally, the input transformer 62 may be configured to step up the voltage and/or step down the voltage as needed. Thus, the input transformer 62 may utilize voltage tapping in order to regulate the input voltage to the setup 60. In any embodiment, the input three phase AC power may pass from the input transformer 62 to the input inductor 66, which may smooth out the AC waveform by removing harmonics before supplying it to the NRC 68. The NRC 68 may contain circuitry configured to perform power conversions, such as switches included in a rectifier. For example, operating in the P-Q control mode, the NRC 68 may convert the supplied AC to direct current (DC) with certain characteristics representative of the desired P (active power) and/or Q (reactive power), which may simulate the torque and flux, respectively, for a simulated load in a test.

After the NRC 68 converts the AC electric power to DC, the DC electricity may be supplied to the CBI 70 via DC bus 71. Similarly, the CBI 70 may contain circuitry configured to perform power conversions, such as switches included in an inverter. For example, using the P-Q control mode, the CBI 70 may convert the DC power back to AC power with certain characteristics representative of the desired P (active power) and/or Q (reactive power), which may simulate the torque and flux, respectively, for a simulated load in a test. The CBI 70 may send the generated AC power to the output inductor 72 to filter out harmonics and smooth out the waveform. By removing harmonics, the output inductor 72 may function to keep the output transformer's temperature down. The AC power may then be passed to the output transformer 74, which may utilize voltage tapping in order to output the proper voltage to the power grid 64. In other words, the output transformer 74 may use a tap to regulate the voltage of the output AC supplied to the power grid 64.

Figure 3:
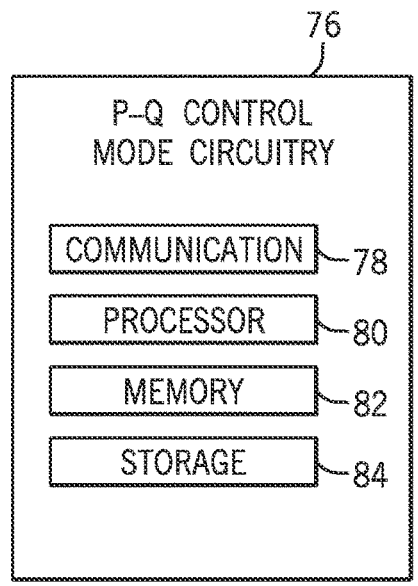
FIG. 3 illustrates a block diagram of P-Q control mode circuitry that may be employed in the setup of FIG. 2 in accordance with embodiments presented herein.

Keeping this in mind, FIG. 3 illustrates a block diagram of various components that may be part of the P-Q control mode circuitry 76 and may be used by the P-Q control mode circuitry 76 to perform P-Q control mode operations. As shown in FIG. 3, the P-Q control mode circuitry 76 may include a communication component 78, a processor 80, a memory 82, a storage 84, and the like. The communication component 78 may be a wireless or wired communication component that may facilitate communication between the motor drive and other systems and/or devices. The processor 80 may be any type of computer processor or microprocessor capable of executing computer-executable code. The memory 82 and the storage 84 may be any suitable articles of manufacture that can serve as media to store processor-executable code, data, or the like. These articles of manufacture may represent tangible, computer-readable media (i.e., any suitable form of memory or storage) that may store the processor-executable code used by the processor 80 to perform the presently disclosed techniques. The memory 82 and the storage 84 may also be used to store received active and reactive power references for particular tests, data analyzed by the processor 80, or the like.

With the foregoing in mind, the setup 60 may be utilized to run many developmental and qualification tests at rated voltage and frequency. Once testing is initiated, the CBI 70 and/or the NRC 68 may execute the P-Q control mode that may run a process included in the P-Q control mode circuitry described above.

Figure 2:
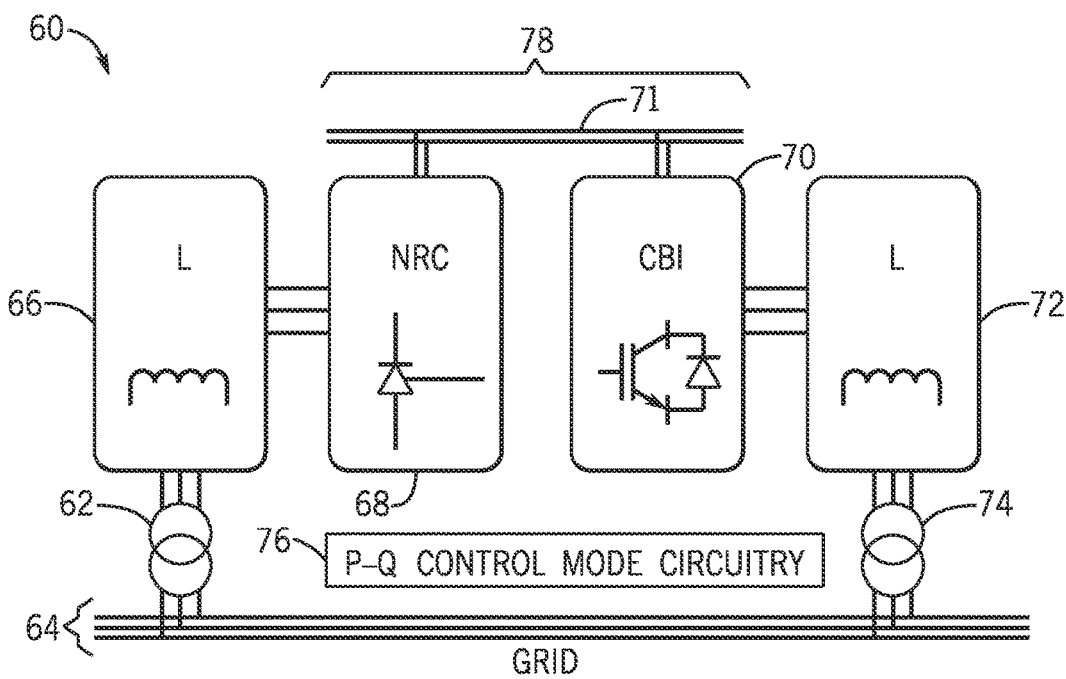
FIG. 2 is a diagrammatical representation of an exemplary dyne-less setup for testing a motor drive in accordance with embodiments presented herein.
Figure 4:
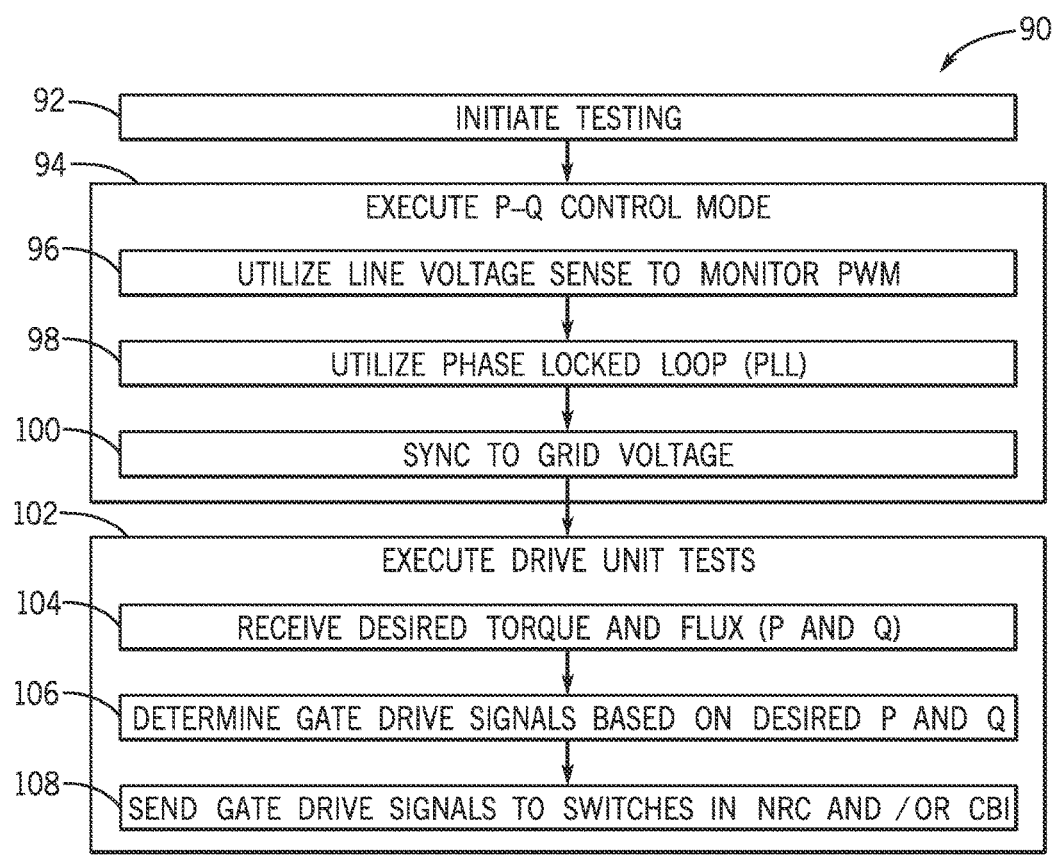
FIG. 4 is a block diagram of an exemplary process for utilizing an active-reactive power control mode with the setup of FIG. 2 to execute various tests in accordance with embodiments presented herein.

The process may be better understood by referring to FIG. 4, which is a block diagram of an exemplary process 90 for utilizing a P-Q control mode with the setup 60 of FIG. 2 to execute various tests in accordance with an embodiment of the present approach. In block 92, the process 90 initiates testing of the motor drive 78, which may include a plurality of tests run individually on the NRC 68, the CBI 70, and/or on the drive 78 (combination of the NRC 68 and the CBI 70). Specifically, the tests may be grouped into categories consisting of temperature testing, voltage fluctuation testing, reliability testing, high power/parallel testing, and liquid cooled specific testing. More specifically, some tests that are a part of the categories may include, but are not limited to, a thermal test, dynamic brake temperature test, overload evaluation, single phase re-rating temperature test, extended range operational temperature test, pre-charge cycle test, over-under voltage (high/low line) test, voltage unbalance test, power factor cap switching test, commutation notch immunity test, soft AC line test, rectifier module test, and so forth.

Once testing is initiated, the process 90 may cause the CBI 70 and/or the NRC 68 to execute the P-Q control mode 76 included in the setup 60 (block 94). When operating in the P-Q control mode 76, the CBI 70 and/or the NRC 68 may utilize line voltage sensing to monitor the pulse width modulation (PWM) of the power output by the CBI 70 (block 96) in the setup 60 and the input power from the power grid 64. In some embodiments, the line voltage sensing may be implemented as an AC input line sensor on a PCB or using other circuitry. The P-Q control mode 76 may obtain a voltage reference (Vref) that is set to the angle of the input AC voltage from the power grid 64. Then, the P-Q control mode 76 may monitor and compare the output power from the CBI 70 to the Vref, and the CBI 70 may set the angle of its output AC power to match the Vref. Therefore, in certain embodiments, the P-Q control mode 76 may utilize a phase-locked loop (PLL) (block 98) to obtain feedback of the measured voltage from the power grid 64 in order to compare it to the voltage of power being output by the CBI 70 in the setup 60. If the voltage of the input power from the power grid 64 and the output power from the CBI 70 of the setup 60 do not match, the P-Q control mode 76 may sync the setup's voltage to the power grid's voltage using the phase-locked loop (block 100). Specifically, the P-Q control mode 76 may cause the CBI 70 to generate an AC sinusoidal waveform with a modified PWM that provides the proper voltage (e.g., Vref phase angle) for the power grid 64. Additionally, as previously mentioned, the output inductor 72 may reduce harmonics of the AC waveform to produce a smooth wave. Further, the output transformer 74 may use voltage tapping to regulate the output voltage of the AC power to the power grid 64.

After the output power by the setup 60 and the input power from the power grid 64 are in lock step, the tests discussed above may be executed (block 102). In certain embodiments, drive unit tests may be run individually on the NRC 68 and/or the CBI 70 separately from the motor drive 78 and/or on the motor drive 78, which is a combination of the NRC 68 and CBI 70. This provides the benefit of verifying that the NRC 68 and the CBI 70 are functioning as expected individually and in combination in the motor drive 78. For example, if one of the motor drive 78 tests fails for some reason, the NRC 68 and the CBI 70 may be tested individually to determine which component may be the cause of the motor drive 78 failure and/or malfunction. Indeed, any of the tests discussed above may be executed for the NRC 68, the CBI 70, and/or the motor drive 78, in addition to other tests not listed, in any combination.

Generally, each test may require a certain amount of torque and/or flux to be generated in order to simulate a load being driven. This torque and/or flux generation may be achieved by the P-Q control mode. As previously discussed, the active power (P) may represent the torque and the reactive power (Q) may represent the flux for a simulated load. Specifically, when testing is initiated and the setup 60 has synced power to the power grid 64, the P-Q control mode 76 may receive desired P (torque) and/or Q (flux) references to simulate for a given test (block 104). Once the setup 60 has received the desired P and Q, the P-Q control mode may determine the gate drive signals that control the operation of switches in each of the rectifier and inverter (NRC 68 and CBI 70, respectively) based upon the desired P and Q references (block 106). Then, the P-Q control mode may communicate the determined gate drive signals to the switches in the NRC 68 and/or the CBI 70, and the NRC 68 and/or the CBI's switches may perform the power conversions accordingly. For example, the switches included in the CBI 70 may fire at a certain rate in order to convert the DC power to AC power with a sinusoidal wave that reflects the P and Q references. Further, the CBI 70 may utilize the P-Q control mode to circulate power to the NRC 68 in order to simulate loading. In this way, the disclosed techniques enable testing a motor drive 78 without the use of a dyne-unit by simulating a load being driven by the motor drive 78, which is configured to utilize a P-Q control mode to generate three phase AC power with configurable torque (P) and flux (Q) under a simulated load in a given test.

As previously mentioned, the disclosed dyne-less setup 60 may provide the benefit of being compact in size. Indeed, in certain embodiments, the dyne-less setup 60 may have a six hundred millimeter width or less. The setup 60 is easily configurable as the NRC 68 and the CBI 70 are capable of being inserted and removed from the setup 60 (e.g., rolled in/rolled out) if they fail one of the above tests, are damaged, and so forth. Additionally, the setup 60 uses near minimal cable length and the installation cost may be reduced due to the fact that a dyne-unit is not being utilized.

While only certain features of the present disclosure have been illustrated and described herein, many modifications and changes will occur to those skilled in the art. It is, therefore, to be understood that the appended claims are intended to cover all such modifications and changes as fall within the true spirit of the present disclosure.

The invention claimed is:

1. A method comprising:
    initiating, via a processor, one or more tests on a motor drive comprising a rectifier and an inverter electrically coupled to each other;
    executing, via the processor, voltage line sensing in order to create a phase-locked loop that syncs an input power of a power grid with an output power from the inverter before the one or more tests are run;
    receiving, via the processor, a desired active power (P) and a desired reactive power (Q) associated with the one or more tests on the motor drive;
    determining, via the processor, one or more gate drive signals to provide to a first set of switches in the rectifier, a second set of switches in the inverter, or a combination thereof, based on the desired P and Q;
    transmitting the one or more gate drive signals from the processor to the rectifier, the inverter, or the combination thereof; and
    operating the rectifier, the inverter, or the combination thereof, under a simulated load that corresponds to the desired P and Q based on the gate drive signals.

2. The method of claim 1, wherein the desired P and Q represent a desired torque and flux, respectively, corresponding to the simulated load for the one or more tests.

3. The method of claim 1, comprising tapping line voltage, via an input transformer and an output transformer that are both configured to electrically couple to a power grid and the motor drive, to regulate the power input by the power grid to the motor drive and the power output by the motor drive to the power grid.

4. The method of claim 3, comprising removing harmonics via an input inductor electrically coupled to the input transformer and the rectifier and an output inductor electrically coupled to the inverter and the output transformer.

5. The method of claim 1, wherein the rectifier is a non-regenerative converter (NRC) and the inverter is a common bus inverter (CBI).

6. The method of claim 1, comprising converting, via the rectifier, from alternating current (AC) to direct current (DC) and converting, via the inverter, from DC to AC.

7. The method of claim 1, wherein the phase-locked loop creates a feedback loop that measures a voltage of the input power of the power grid to obtain a voltage reference angle (Vref) and compares the Vref with a voltage of the output power of the inverter to determine whether the voltages match and sets an output power voltage angle from the inverter to match the Vref.

8. A non-transitory computer-readable medium storing computer instructions, the computer instructions configured to:
    run one or more tests on a motor drive comprising a non-regenerative converter (NRC) and a common bus inverter (CBI) by receiving a desired active power (P)

and a desired reactive power (Q) references that represent torque and flux, respectively, corresponding to a simulated load;

execute a phase-locked loop that syncs output power from the motor drive with input power from a power grid before the one or more tests are run;

determine gate drive signals based on the desired P and Q references, wherein the gate drive signals are configured to operate switches of the NRC, CBI, or any combination thereof, under a simulated load that corresponds to the desired P and Q; and transmit the gate drive signals to the NRC, the CBI, or any combination thereof.

9. The non-transitory computer-readable medium storing computer instructions of claim 8, wherein the one or more tests are at rated voltage and frequency only.

10. The non-transitory computer-readable medium storing computer instructions of claim 8, wherein the CBI controls loading on the NRC by circulating active power.

11. The non-transitory computer-readable medium storing computer instructions of claim 8, wherein the phase-locked loop creates a feedback loop that measures a voltage of the input power of the power grid to obtain a voltage reference angle (Vref) and compares the Vref with a voltage of output power of the CBI to determine whether the voltages match and sets an output power voltage angle from the CBI to match the Vref.

12. A method comprising:
initiating, via a processor, one or more tests on a motor drive comprising a rectifier and an inverter electrically coupled to each other;

executing, via the processor, voltage line sensing in order to create a phase-locked loop that syncs an input power of a power grid with an output power from the inverter before the one or more tests are run, wherein the phase-locked loop creates a feedback loop that measures a voltage of the input power of the power grid to obtain a voltage reference angle (Vref) and compares the Vref with a voltage of the output power of the inverter to determine whether the voltages match and sets an output power voltage angle from the inverter to match the Vref;

receiving, via the processor, a desired active power (P) and a desired reactive power (Q) associated with the one or more tests on the motor drive;

determining, via the processor, one or more gate drive signals to provide to a first set of switches in the rectifier, a second set of switches in the inverter, or a combination thereof, based on the desired P and Q;

transmitting the one or more gate drive signals from the processor to the rectifier, the inverter, or the combination thereof; and operating the rectifier, the inverter, or the combination thereof, under a simulated load that corresponds to the desired P and Q based on the gate drive signals.

13. The method of claim 12, wherein the desired P and Q represent a desired torque and flux, respectively, corresponding to the simulated load for the one or more tests.

14. The method of claim 12, comprising tapping line voltage, via an input transformer and an output transformer that are both configured to electrically couple to a power grid and the motor drive, to regulate the power input by the power grid to the motor drive and the power output by the motor drive to the power grid.

15. The method of claim 14, comprising removing harmonics via an input inductor electrically coupled to the input transformer and the rectifier and an output inductor electrically coupled to the inverter and the output transformer.

16. The method of claim 12, wherein the rectifier is a non-regenerative converter (NRC) and the inverter is a common bus inverter (CBI).

17. The method of claim 12, comprising converting, via the rectifier, from alternating current (AC) to direct current (DC) and converting, via the inverter, from DC to AC.

* * * * *